United States Patent
Kato et al.

(10) Patent No.: US 7,075,188 B2
(45) Date of Patent: Jul. 11, 2006

(54) CIRCUIT DEVICE AND METHOD FOR MANUFACTURING THE SAME

(75) Inventors: Takuji Kato, Saitama (JP); Isao Ochiai, Gunma (JP); Katsuhiko Shibusawa, Gunma (JP)

(73) Assignees: Sanyo Electric Co., Ltd., Osaka (JP); Kanto Sanyo Semiconductors Co., Ltd., Gunma (JP)

( * ) Notice: Subject to any disclaimer, the term of this patent is extended or adjusted under 35 U.S.C. 154(b) by 0 days.

(21) Appl. No.: 10/785,471

(22) Filed: Feb. 24, 2004

(65) Prior Publication Data

US 2004/0212059 A1 Oct. 28, 2004

(30) Foreign Application Priority Data

Feb. 28, 2003 (JP) .................. P. 2003-052318

(51) Int. Cl.
*H01L 21/26* (2006.01)
*H01L 21/42* (2006.01)

(52) U.S. Cl. ............ 257/787; 257/680; 438/127

(58) Field of Classification Search ........ 257/434, 257/680, 787, 796, 723, 724; 438/116, 127, 438/456, 760
See application file for complete search history.

(56) References Cited

U.S. PATENT DOCUMENTS

| | | | | |
|---|---|---|---|---|
| 4,663,833 A | * | 5/1987 | Tanaka et al. | 438/65 |
| 6,420,204 B1 | * | 7/2002 | Glenn | 438/64 |
| 6,483,030 B1 | * | 11/2002 | Glenn et al. | 174/52.4 |
| 6,624,921 B1 | * | 9/2003 | Glenn et al. | 359/291 |
| 6,643,919 B1 | * | 11/2003 | Huang | 29/827 |
| 6,774,469 B1 | * | 8/2004 | Utsumi | 257/679 |
| 6,815,829 B1 | * | 11/2004 | Shibata | 257/777 |
| 6,828,674 B1 | * | 12/2004 | Karpman | 257/711 |
| 6,849,915 B1 | * | 2/2005 | Tsai | 257/432 |

* cited by examiner

*Primary Examiner*—S. V. Clark
(74) *Attorney, Agent, or Firm*—Fish & Richardson

(57) ABSTRACT

In order to provide a circuit device 10 where a second circuit element 15B is exposed from a sealing resin 16, a circuit device 10A comprises: an island 12 to whose top a first circuit element 15A is fixedly fitted; a plurality of leads 11 which are extended around the island 12 and electrically connected to the first circuit element 15A; a sealing resin 16 which seals the first circuit element 15A, the island 12, and leads 11 and forms a cavity portion 18; and a second circuit element 15B stored in the cavity portion 18. Accordingly, since the second circuit element 15B can be externally provided, the degree of freedom for mounting can be improved.

6 Claims, 7 Drawing Sheets

CIRCUIT DEVICE AND METHOD FOR MANUFACTURING THE SAME

BACKGROUND OF THE INVENTION

1. Field of the Invention

The present invention relates to a circuit device having a plurality of circuit elements such as semiconductor devices and a method for manufacturing the same.

2. Description of the Related Art

FIG. 8 is a plan view of a circuit device 100, and a structure thereof will be described with reference to the drawing.

In the vicinity of a central portion of the circuit device 100, an island 101 is arranged. A plurality of semiconductor elements 105 are securely fitted on the island formed in a rectangular form. A plurality of leads 102 extend so as to surround the island 101. One end of the lead 102 is approximated to the island 101 and is electrically connected to the semiconductor element 105 by a thin metal wire 103. In addition, the other end of the lead 102 extends outside from a sealing resin 104 to seal the whole and forms an external electrode.

However, in the above-described circuit device 10, all semiconductor elements 105 are sealed by the sealing resin 104. In addition, if either of the semiconductor devices 105 is a semiconductor element having a memory, replacement of the semiconductor element is required for a change of this memory. Therefore, because all semiconductor devices are resin-sealed, rearrangement of semiconductor elements is troublesome in the circuit device 10, therein a problem has existed.

Furthermore, since the plurality of semiconductor elements 105 are built in, if a failure occurs in either semiconductor element 105, the circuit device 100 itself fails, and improvement in the yield is limited, therein a problem has existed.

SUMMARY OF THE INVENTION

The embodiment of present invention has been made in view of the problems, and it is a principal object of the embodiment of present invention to provide a circuit device which solves the above-described problems by a structure wherein built-in circuit elements are exposed from a sealing resin.

A circuit device of the embodiment of present invention has a configuration in which circuit element is sealed by a sealing resin, wherein a cavity portion is provided in the sealing resin, and the circuit element is stored in the cavity portion.

A circuit device of the embodiment of present invention comprises: an island on which a first circuit element is affixed; a plurality of leads which extend around the island and are electrically connected to the first circuit element; a sealing resin which seals the first circuit element, island, and leads and forms a cavity portion; and a second circuit element stored in the cavity portion.

A method for manufacturing a circuit device of the present invention comprises: sealing a first circuit element electrically connected to an external electrode with a sealing resin, and furthermore, providing a cavity portion in the sealing resin; and storing a second circuit element in the cavity portion.

According to the embodiment of present invention, the second circuit element 15B can be stored in the cavity portion 18 provided in the sealing resin 16 to seal the whole. Accordingly, by only a change of the second circuit element 15B, functions of the circuit device 10 can be changed.

Furthermore, if a semiconductor element having a memory portion such as a ROM is employed as a second circuit element 15B, it becomes possible to incorporate user-specific information into the second circuit element 15B. Accordingly, by commonly using the first circuit element 15A of a signal processing element and specializing the second circuit element 15B in each user, it becomes possible to respond to respective users only by changing the second circuit element 15B.

DESCRIPTION OF THE PREFERRED EMBODIMENTS

Figure 1A:
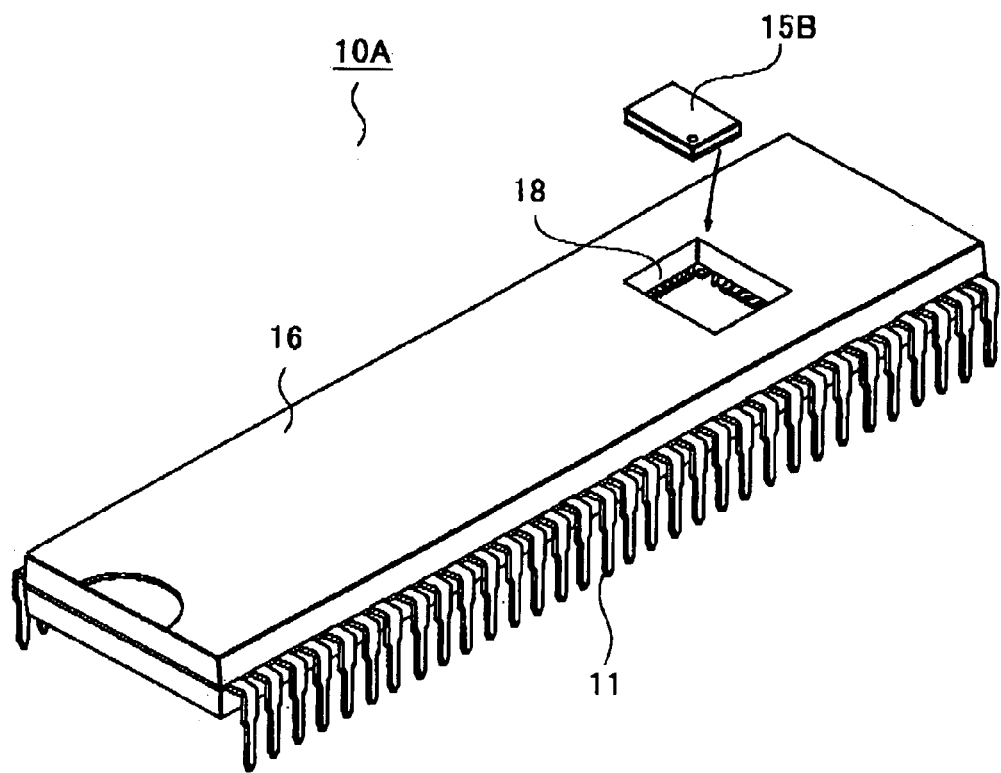
FIG. 1A is a perspective view and FIG. 1B is a sectional view showing a circuit device of the embodiment of present invention.
Figure 1B:
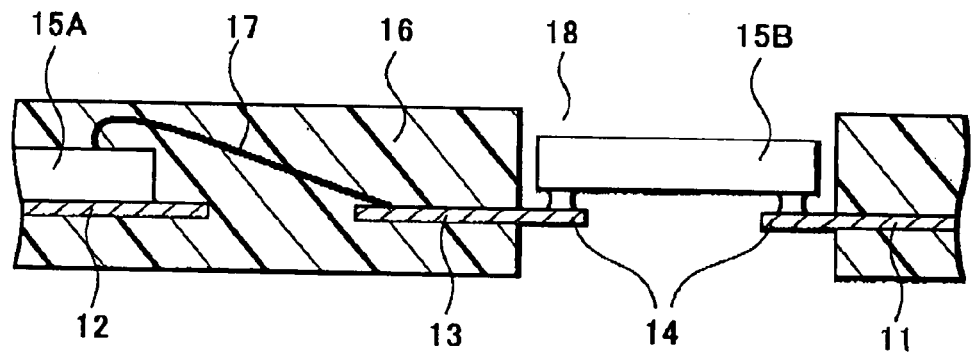

Referring to FIG. 1, a configuration of a circuit device 10A of the present embodiment will be described. FIG. 1A is a perspective view of the circuit device 10A, and FIG. 1B is a sectional view thereof.

Referring to FIG. 1A and FIG. 1B, the circuit device 10A of an embodiment comprises: an island 12 to whose top a first circuit element 15A is fixedly fitted; a plurality of leads which extend around the island 12 and are electrically connected to the first circuit element 15A; a sealing resin 16 which seals the first circuit element 15A, island 12, and leads 11 and forms a cavity portion 18; and a second circuit element 15B stored in the cavity portion. These respective components will be described in the following.

As the first circuit element 15A, a semiconductor device is herein employed, and this is fixedly fitted on the island 12 via an adhesive. And, the first circuit element 15A and leads 11 are electrically connected via thin metal wires 17. Furthermore, bridges 13 and the first circuit element 15A are connected via thin metal wires 17. In addition, as the first circuit element 15A, a semiconductor element to perform signal processing can be employed. Concretely, a circuit to process a moving image displayed on a display of a television or the like can be formed on the first circuit element 15A. In addition, a circuit to control a memory portion, etc., of the second circuit element 15B may be formed on the first circuit element 15A. In addition, as the first circuit element 15A, in addition to a semiconductor element, a passive element such as a resistor or capacitor and an active element such as a diode can be generally employed. Furthermore, it is also satisfactory that a plurality of elements out of these are employed as a first circuit element 15A.

As the second circuit element 15B, a semiconductor element can be employed. The second circuit element 15B is fixedly fitted with its face down to the leads 11 and bridges 13 exposed inside the cavity portion 18 via a brazing material such as a solder. Herein, as the second circuit element 15B, a semiconductor element having a memory portion such as a ROM (Read Only Memory) can be employed. Concretely, additional information such as a number of channels, which is displayed in a manner superposed with an image on a display portion of a television or the like, can be built in the above-described ROM. In addition, as the second circuit element, it is also possible to employ, in addition to a bare IC chip, a resin package having a semiconductor element built-in. When a package such as a BGA (Ball Grid Array) is employed as a second circuit element 15B, this is fixedly fitted to connection terminals 14 by surface mounting.

As a material of the sealing resin 16, a thermoplastic resin or a thermosetting resin can be generally employed. Herein, the first circuit element 15A, second circuit element 15B, island 12, leads 11, and bridges 13 are sealed by the sealing resin 16. In addition, in a region where the second circuit element 15B is placed, the cavity portion 18, which is a region where the sealing resin 16 has been partially removed, is formed.

The cavity portion 18 is a region where the sealing resin 16 has been partially removed, and is formed so that the size is slightly greater than that of the second circuit element 15B to be stored therein. In addition, from four sides of a lateral side portion of the cavity portion 18, end portions of the leads 11 and end portions of the bridges 13 are exposed to form connection terminals to the second circuit element 15B. Herein, it is also possible to provide a plurality of cavity portions 18.

Figure 2:
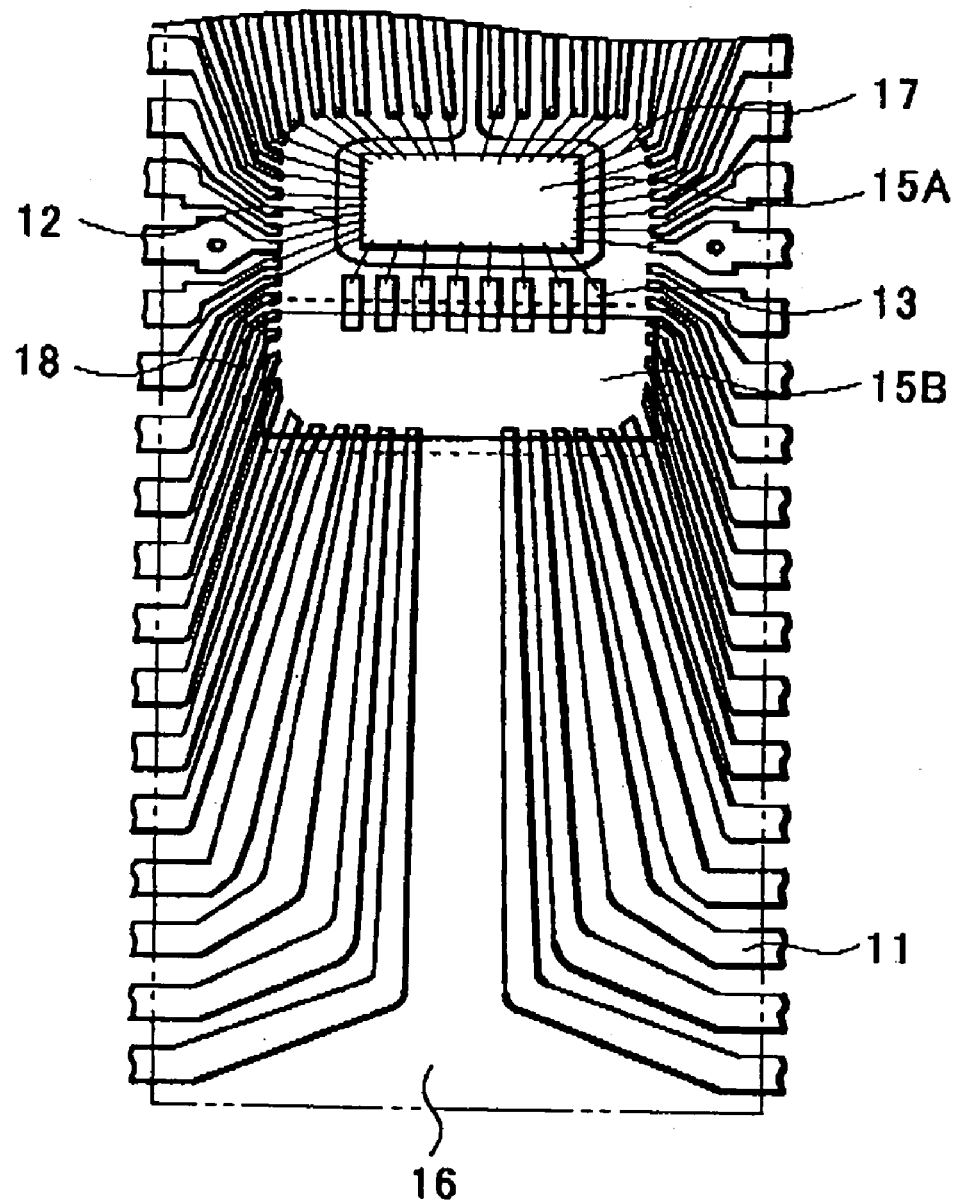
FIG. 2 is a plan view showing a circuit device of the embodiment of present invention.

Next, referring to FIG. 2, a plane configuration of the circuit device 10A will be mainly described.

For the island 12, material thereof is selected in consideration of adhesive characteristics of the brazing material, bonding characteristics, and plating characteristics, and the material is formed of a metal mainly of Cu, a metal mainly of Al, or an alloy such as Fe—Ni. In addition, on the top of the island 12, the first circuit element 15A is mounted via an adhesive.

The leads 11 are formed of a material identical to that of the above-described island 12, wherein one end of each is approximated to the island 12 and is connected to a element and the other end is exposed outside from the sealing resin 16 to form an external electrode. Herein, the leads 11 are lead out from two opposing sides of the sealing resin 16 to form a DIP (Dual Inline Package). However, it is also possible to employ packaging methods of other embodiments such as a QFP (Quad Flat Package) and a QFN (Quad Flat Non-leaded Package).

The bridges 13 are arranged in a plural number between the first circuit element 15A and second circuit element 15B, and have a function to electrically connect both circuit elements. In addition, the individual bridges 13 are electrically independently provided. Herein, the first circuit element 15A is connected to one end of the bridge 13 via a thin metal wire 17. Furthermore, via a brazing material such as solder, the second circuit element 15B is connected to the other end of the bridge 13.

Figure 3A:
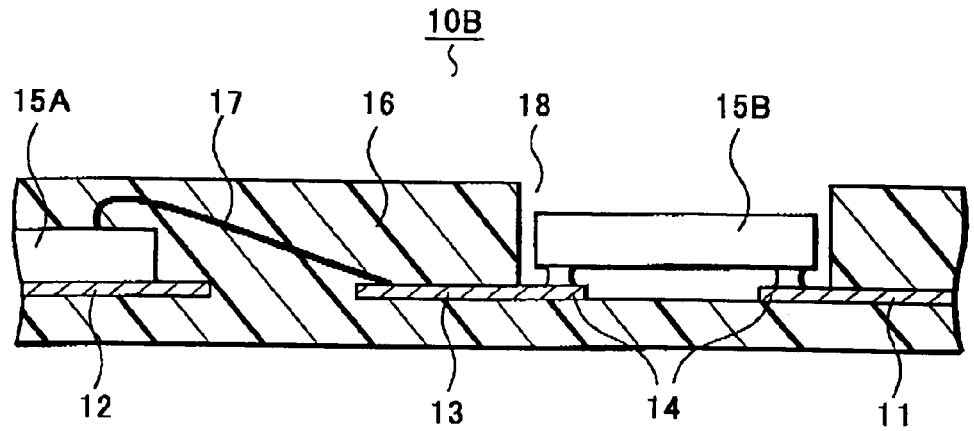
FIG. 3A is a sectional view.
Figure 3B:
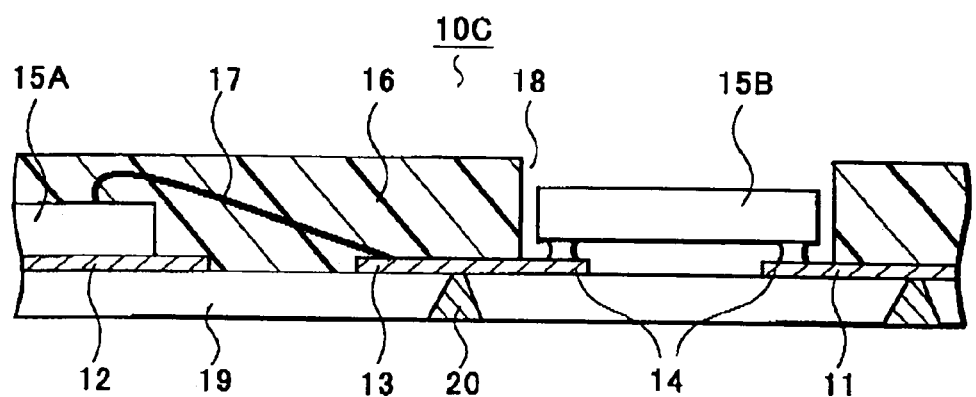
FIG. 3B is a sectional view.

Referring to FIGS. 3, configurations of circuit devices of other embodiments will be described. FIG. 3A to FIG. 3B are sectional views of the respective embodiments. A plane configuration is basically the same as that of the above-described circuit device 10.

Referring to FIG. 3A, a configuration of the circuit device 10B will be described. Herein, inside the cavity portion 18, the sealing resin is formed under the bridge and lead 11. Other aspects of the configuration are the same as those of the circuit device 10A.

Referring to FIG. 3B, a configuration of the circuit device 10C will be described. Herein, the island 12, bridge 13, and lead 11 are formed on the surface of a mounting substrate 19, and an external electrode 20 provided in a manner penetrating the mounting substrate 19 and the lead 11, etc., are electrically connected.

Figure 3C:
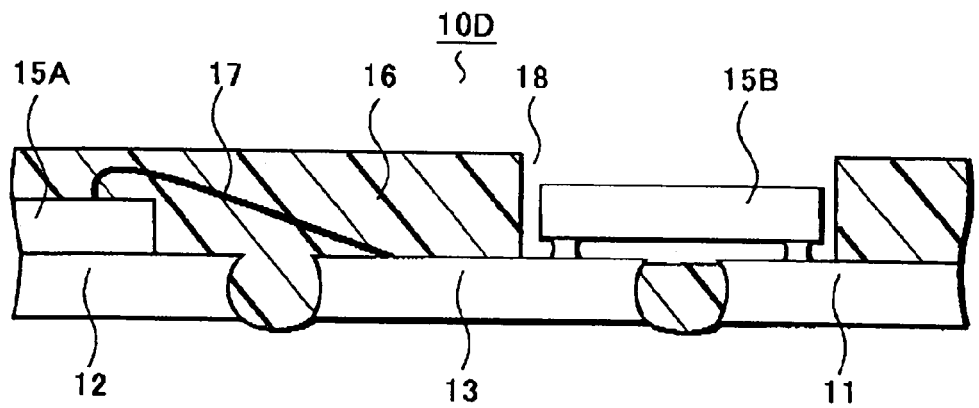
FIG. 3C is a sectional view showing a circuit device of the embodiment of present invention.

Referring to FIG. 3(C), a configuration of the circuit device 10D will be described. Herein, the island 12, bridge 13, and lead 11 are formed in a manner embedded in the sealing resin 16. In addition, side surfaces of the lead 11, etc., are formed in a curved manner, whereby adhesion to the sealing resin 16 is improved.

Next, referring to FIG. 4 to FIG. 7, a method for manufacturing the circuit device 10A shown in FIG. 1 will be described.

Figure 4:
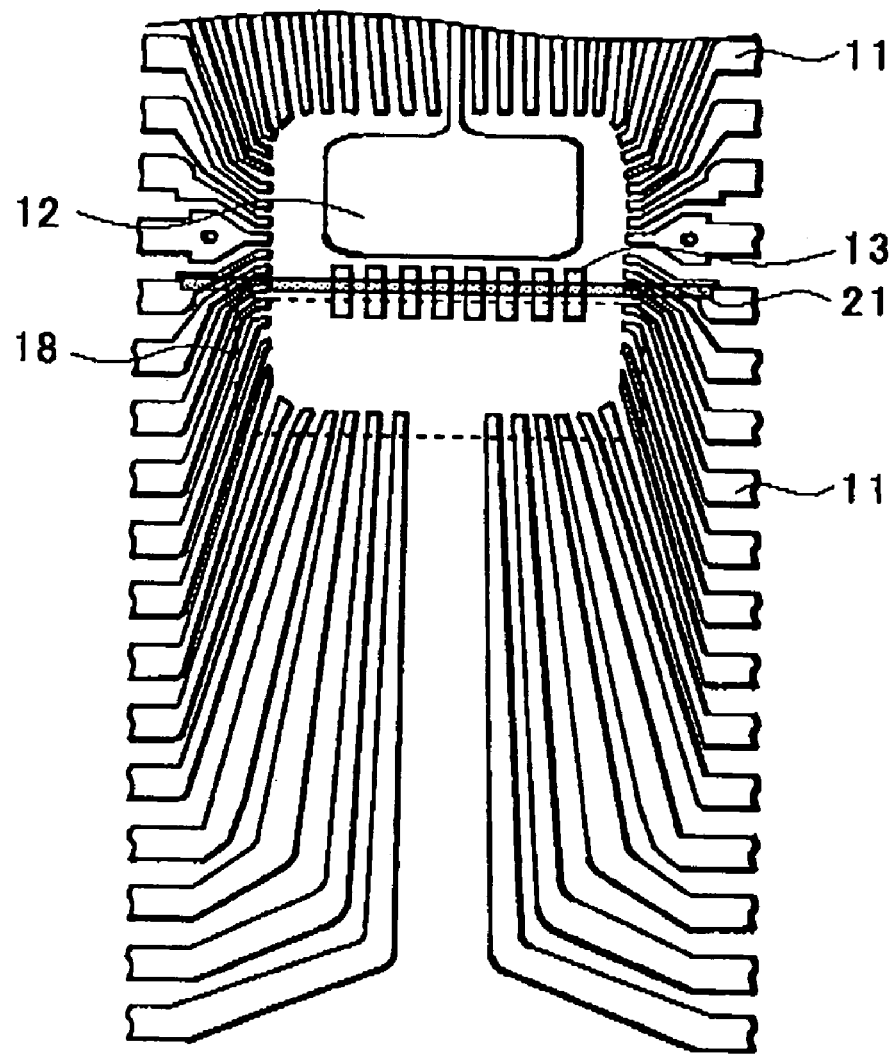
FIG. 4 is a plan view showing a circuit device of the embodiment of present invention.

First, referring to FIG. 4, an island 12, bridges 13, and leads 11 are formed by shaping a metal plate. This step can be carried out by a press or etching step. Herein, suspension leads to fix the island 12 may be provided. In addition, since the bridges 13 are not electrically connected to other positions, the bridges 13 can be fixed by taping the bridges 13 to an adhesive tape 21. In addition, connection terminals formed of end portions of the bridges 13 or leads 11 are formed around a cavity portion 18 to be formed.

Figure 5A:
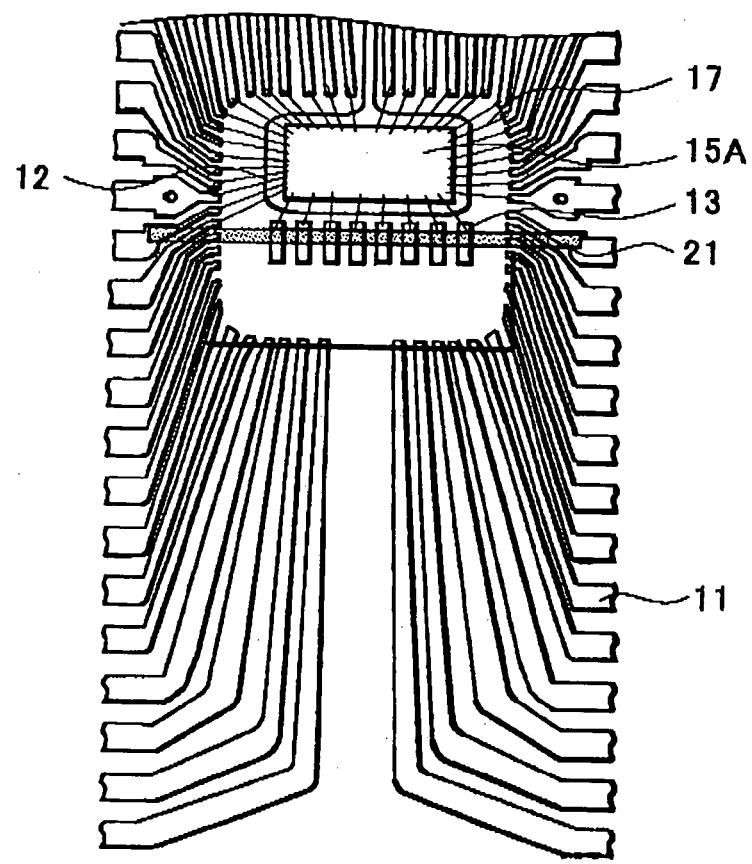
FIG. 5A is a plan view and FIG. 5B is a sectional view showing a method for manufacturing a circuit device of the embodiment of present invention.
Figure 5B:
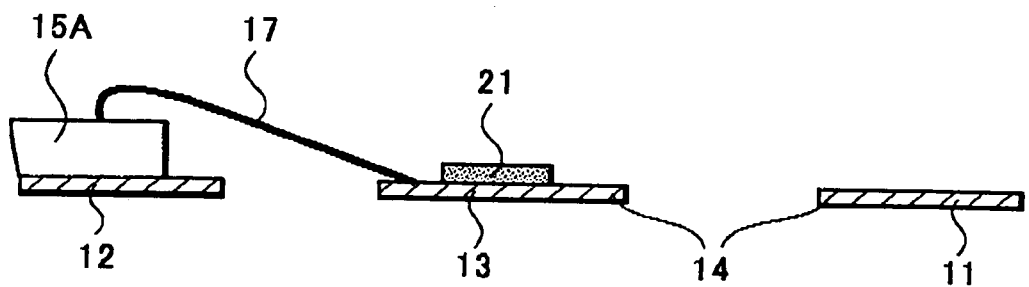

Next, referring to FIG. 5, a first circuit element 15A is fixedly fitted. First, via an adhesive, the first circuit element 15A is fixedly fitted to the island 12. Next, via thin metal wires 17, the leads 11 or bridges 13 and the first circuit element 15A are electrically connected.

Figure 6:
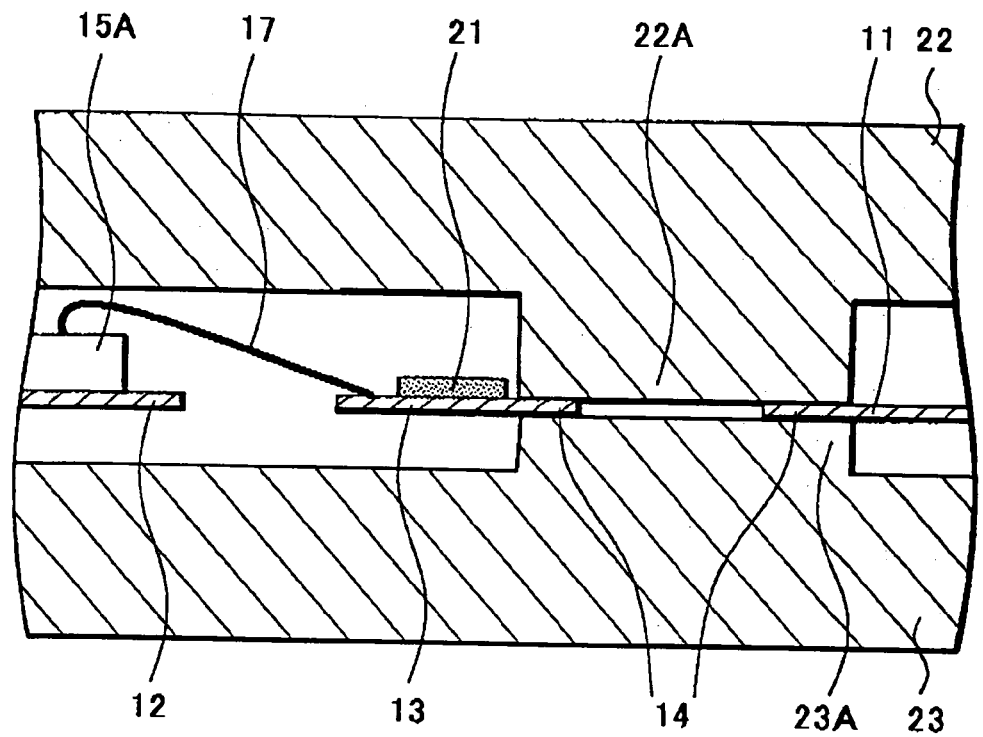
FIG. 6 is a sectional view showing a method for manufacturing a circuit device of the embodiment of present invention.

Next, referring to FIG. 6, the upper surfaces of connection terminals 14 in a position where a second circuit element 15B is connected are protected while sealing is carried out by a sealing resin 16. This step can be carried out by injection molding by use of a thermoplastic resin or transfer molding by use of a thermosetting resin. A metal mold used in this step is composed of an upper metal mold 22 and a lower metal mold 23, and a convex part 22A of a size corresponding to the cavity portion 18 is provided in the upper metal mold 22. Furthermore, in the lower metal mold 23 as well, a convex part 22A may be provided at an identical position to the upper metal mold.

Resin sealing is carried out in a condition where the lower surface of the convex part 22A of the upper metal mold 22 is in contact with the upper surface of the connection terminal 14. Thereby, the sealing resin 16 is prevented from adhering to the upper surfaces of the connection terminals 14. Furthermore, resin sealing may be carried out after the upper surfaces of the connection terminals 14 are covered by a resinous tape. In addition, after this step ends, quality of the first circuit element 15A and connection positions thereof is checked by measurement of electrical characteristics. And, only ones judged to be non-defective by this measurement are transferred to the next step. Accordingly, since only confirming second circuit elements 15B are employed in the next step as well, the yield can be improved.

Figure 7:
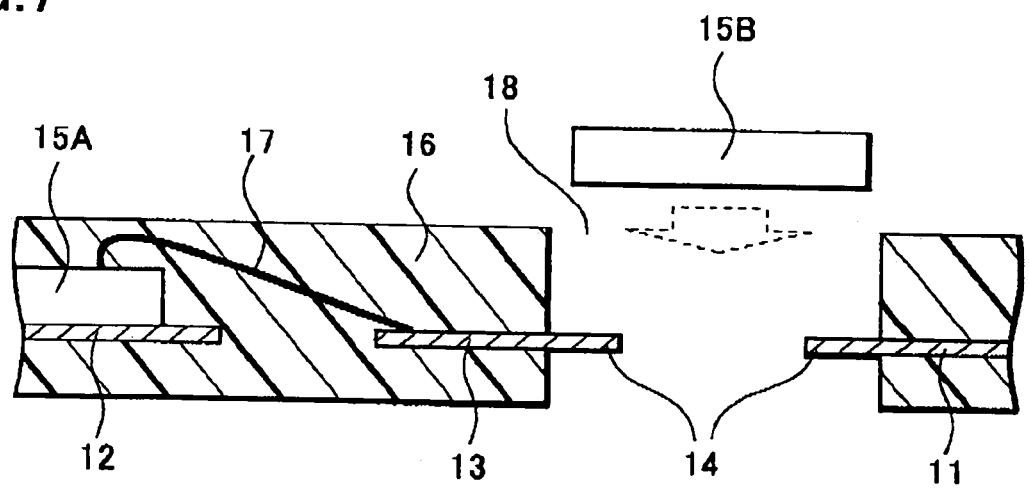
FIG. 7 is a sectional view showing a method for manufacturing a circuit device of the embodiment of present invention.
Figure 8:
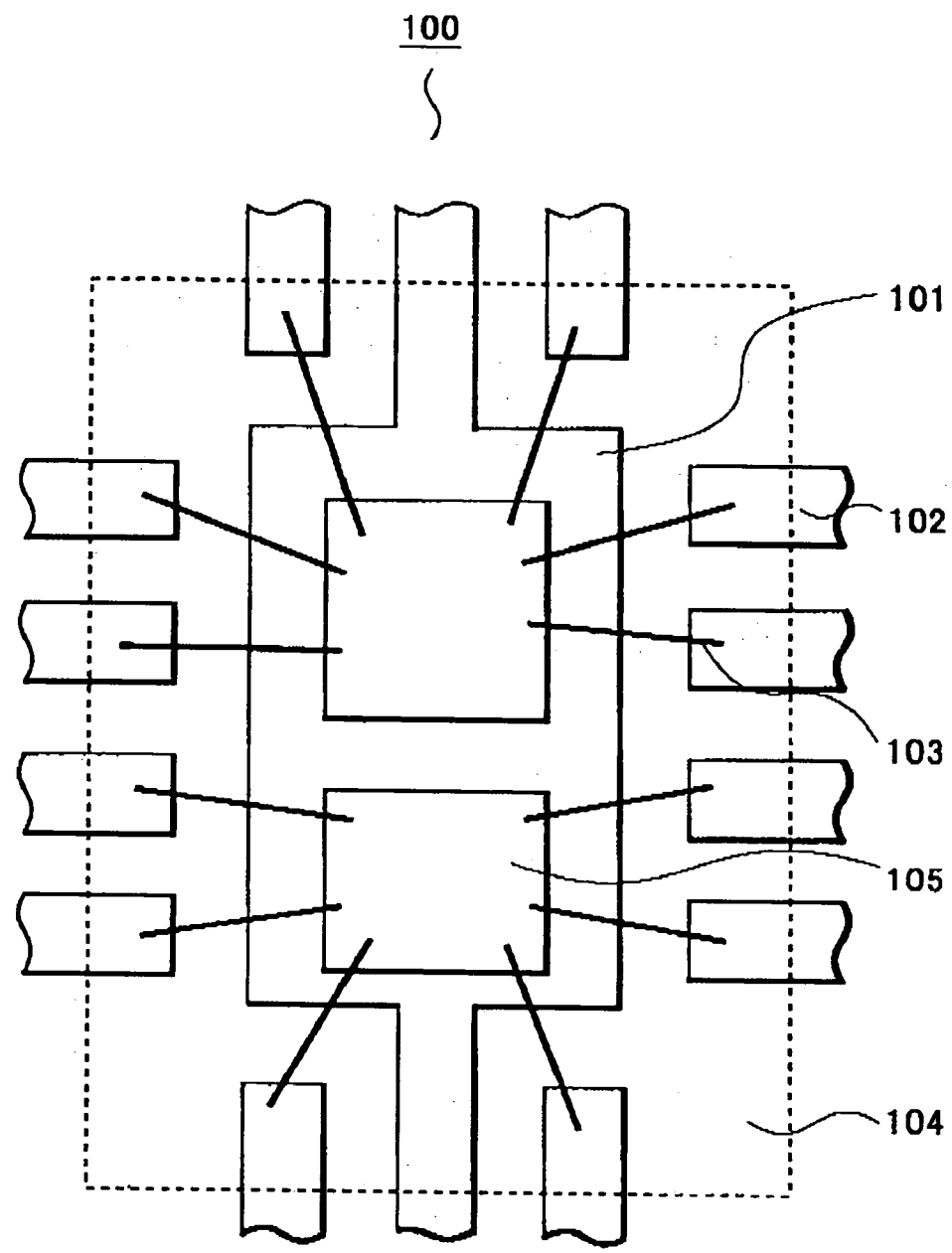
FIG. 8 is a plan view showing a related circuit device.

Next, referring to FIG. 7, the second circuit element 15B is stored in the cavity portion 18. Concretely, the second circuit element 15B is fixedly fitted with its face down to the connection terminals 14 exposed inside from the four sides of the cavity portion 18 via a brazing material. Through the above steps, a circuit device 10A is manufactured.

In addition, in the present embodiment, the circuit device 10A can also be delivered, without fixedly fitting the second circuit element 15B by a brazing material, only with the second circuit element 15B mechanically stored in the cavity portion 18. In this case, although the second circuit element 15B is not fixedly fitted, since the second circuit element 15B is mechanically in contact with the contact terminals 14, a test can be performed without a problem. Fixed fitting of the second circuit element 15B can be simultaneously performed in a reflow step of placing the circuit device 10A on a motherboard or the like. Accordingly, it becomes possible to change the second circuit element 15B until the last step where the circuit device 10A is mounted on a set.

The advantage of present embodiment exists in that cavity portion 18 is provided in the circuit device 10, and the second circuit element 15B can be externally provided in this cavity portion 18. Concretely, the first circuit element 15A, which is a semiconductor element to perform signal processing, is built in the sealing resin 13. And, the second circuit element 15B having a memory portion where setting information, etc., is stored can be externally provided in the above-described cavity portion 18. Accordingly, even when setting information is different depending on the users, by only preparing the second circuit element 15B for each user, other parts can be prepared in common. For example, in terms of a control module of a video apparatus such as a television, the character style and font size for displaying channel numbers are different among users. Therefore, by storing the information in the second circuit element 15B, a circuit device 10 as a control module to satisfy user demands can be provided by only replacing the second circuit element 15B.

What is claimed is:

1. A semiconductor device comprising:
   an island on which a first circuit element, comprising a semiconductor element, is mounted;
   a plurality of first leads which extend around the island and are electrically connected to the first circuit element;
   a sealing resin which seals the first circuit element, the island, and the first leads;
   a cavity in the sealing resin, wherein a second circuit element is stored in the cavity; and
   second leads, wherein one end thereof is electrically connected to the second circuit element inside the cavity and the other end thereof is exposed from the sealing resin,
   wherein a position of each second lead exposed inside the cavity corresponds to a position of an electrode on a rear surface of the second circuit element; and wherein the first circuit element is located in an area other than the cavity.

2. The device of claim 1 wherein the first circuit element is adapted to perform signal processing, and the second circuit element includes a memory portion controlled by the first circuit element.

3. A method for manufacturing a semiconductor device comprising:
   sealing a first circuit element, comprising a semiconductor element electrically connected to first leads, with a sealing resin;
   providing a cavity in the sealing resin; and
   storing a second circuit element in the cavity, wherein the first leads extend around an island on which the first circuit element is disposed and are electrically connected to the first circuit element, and wherein second leads include one end electrically connected to the second circuit element inside the cavity and another end exposed from the sealing resin;
   wherein a position of each second lead exposed inside the cavity corresponds to a position of an electrode on a rear surface of the second circuit element, and the first circuit element is located in an area other than the cavity.

4. The method of claim 3 wherein the second circuit element is stored in the cavity portion after performing a test of the first circuit element.

5. The method of claim 3 including:
   placing the second circuit element on the second leads in the cavity, and
   fixedly fitting the second circuit element by a reflow process.

6. The device of claim 1 comprising:
   third leads, wherein one end thereof is close to the island and the other end thereof is exposed to the cavity, wherein the first circuit element is electrically connected to the second circuit element through the third leads.

* * * * *